(12) United States Patent
Kohara (10) Patent No.: US 7,307,864 B2
(45) Date of Patent: Dec. 11, 2007

(54) SEMICONDUCTOR INTEGRATED CIRCUIT WITH FUSE DATA READ CIRCUIT

(75) Inventor: Koji Kohara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 90 days.

(21) Appl. No.: 11/409,389

(22) Filed: Apr. 21, 2006

(65) Prior Publication Data

US 2006/0245232 A1    Nov. 2, 2006

(30) Foreign Application Priority Data

Apr. 27, 2005   (JP)   ............... 2005-129607

(51) Int. Cl.
*G11C 17/00*    (2006.01)
(52) U.S. Cl. .............. 365/96; 365/189.01; 365/189.09; 365/225.7
(58) Field of Classification Search .................. 365/96, 365/189.01, 189.09, 225.7; 337/163
See application file for complete search history.

(56) References Cited

U.S. PATENT DOCUMENTS 5,995,413 A * 11/1999 Holzmann et al. ..... 365/185.09
6,472,897 B1 * 10/2002 Shyr et al. ................... 324/765
7,187,599 B2 * 3/2007 Schnell et al. .............. 365/194
2002/0069394 A1   6/2002 Gavrila et al.
2005/0280495 A1 * 12/2005 Douzaka et al. ............. 337/163

FOREIGN PATENT DOCUMENTS

JP   2002-231816   8/2002

* cited by examiner

*Primary Examiner*—Anh Phung
*Assistant Examiner*—Toan Le
(74) *Attorney, Agent, or Firm*—DLA Piper US LLP (57) ABSTRACT

A first fuse element, a second fuse element, a read trim value automatic adjustment circuit, and a fuse data read circuit are provided. The second fuse element determines a data reading condition for the first fuse element. The read trim value automatic adjustment circuit applies a constant voltage across the second fuse element prior to reading data from the first fuse element, then reads data from the second fuse element and, on the basis of the results of the read, outputs a trim value to specify the desired read condition for the first fuse element. The fuse data read circuit applies a constant voltage across the first fuse element and then reads data from it according to the read timing or the read reference voltage set on the basis of the trim value output from the read trim value automatic adjustment circuit.

20 Claims, 12 Drawing Sheets

SEMICONDUCTOR INTEGRATED CIRCUIT WITH FUSE DATA READ CIRCUIT

CROSS-REFERENCE TO RELATED APPLICATIONS

This application is based upon and claims the benefit of priority from prior Japanese Patent Application No. 2005-129607, filed Apr. 27, 2005, the entire contents of which are incorporated herein by reference.

BACKGROUND OF THE INVENTION

1. Field of the Invention

The present invention relates to a semiconductor integrated circuit having electrically writable fuse elements and more particularly to a fuse data read circuit adapted to automatically adjust reading parameters used in reading data from the fuse elements.

2. Description of the Related Art

There are various types of electrically writable fuse elements (hereinafter referred to as fuse elements) which are built in to semiconductor integrated circuits: gate oxide destruction type, deep trench (DT) oxide destruction type, polysilicon blow type, and so on.

With the fuses, there is a difference in resistance between a "1" fuse, which stores "1" data as the result of being previously written with "1", and a "0" fuse, which stores "0" data without being written with "1".

To read data from the fuse, it is required to apply a constant voltage across the fuse. After the voltage application, the voltage across the "1" fuse rises faster and consequently reaches a large value more quickly than the voltage across the "0" fuse. After the lapse of a fixed period of time from the voltage application, therefore, a large voltage difference is produced between the "1" and "0" fuses according to their difference in resistance.

In reading data from a fuse, the voltage across the fuse is compared with a decision reference voltage at a point of time after the voltage application to thereby decide whether the fuse is a "1" fuse or a "0" fuse. For such voltage comparison and fuse data decision, a fuse data read circuit is used. With a conventional fuse data read circuit, the read timing or the decision reference voltage for detecting the voltage across the fuse after voltage application is fixed.

As semiconductor integrated circuit processes advance, the difference in resistance between "1" and "0" fuses tends to become more smaller. In addition, there is a problem that all the characteristics of fuses cannot be appreciated at the initial stage of integrated circuit design.

However, when the read timing or the decision reference voltage, which is fixed, is not set suitably, it will be required to redesign circuits that use fuse data.

Japanese Patent Application KOKAI Publication No. 2002-231816 discloses a technique to permanently adjust a trimming circuit containing one or more fuses offline according to the optimum trim bit sequence.

BRIEF SUMMARY OF THE INVENTION

According to an aspect of the present invention, there is provided a semiconductor integrated circuit comprising: a data fuse element which stores data in the form of a variation in its resistance according to whether it has been subjected to an electrical write operation or not, the data being read upon application of a voltage across it; at least one adjustment fuse element which has substantially the same electrical characteristics as the data fuse element and determines a data reade condition for the data fuse element; a trim value adjustment circuit which is connected to the adjustment fuse element and which applies a constant voltage across the adjustment fuse element prior to reading data from the data fuse element, then reads data from the adjustment fuse element and, on the basis of the results of the read, outputs a trim value to specify the read conditions for the data fuse element; and a fuse data read circuit which is connected to the trim value adjustment circuit and the data fuse element and which applies a constant voltage across the data fuse element and then reads data from the data fuse element according to the trim value output from the trim value adjustment circuit.

DETAILED DESCRIPTION OF THE INVENTION

The preferred embodiments of the present invention will be described hereinafter with reference to the accompanying

First Embodiment

Figure 1:
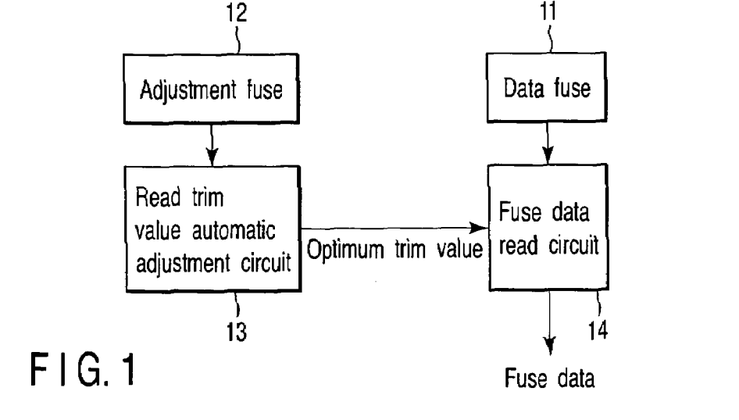
FIG. 1 is a block diagram of a semiconductor integrated circuit according to a first embodiment of the present invention.

FIG. 1 shows a data read circuit in a semiconductor integrated circuit according to a first embodiment of the present invention.

A data fuse 11 includes of an electrically writable fuse which stores data of either "1" or "0" in the form of a variation in resistance according to whether it has been subjected to an electrical write operation or not. The data is read from the fuse on the basis of its resistance when a voltage is applied across it.

A read trim adjustment fuse circuit 12 is provided to determine the read conditions for the data fuse 11. The adjustment fuse circuit 12 includes at least one electrically writable fuse which has substantially the same electrical characteristics as the data fuse 11.

A read trim value automatic adjustment circuit 13 reads data from the adjustment fuse circuit 12 in advance and then outputs a trim value to specify the optimum read condition for the data fuse 11, that is, the optimum read timing, the optimum decision reference voltage, etc.

A fuse data read circuit 14 applies a constant voltage across the data fuse 11 and then reads data from the data fuse on the basis of the trim values from the read trim value automatic adjustment circuit 13.

Figure 2:
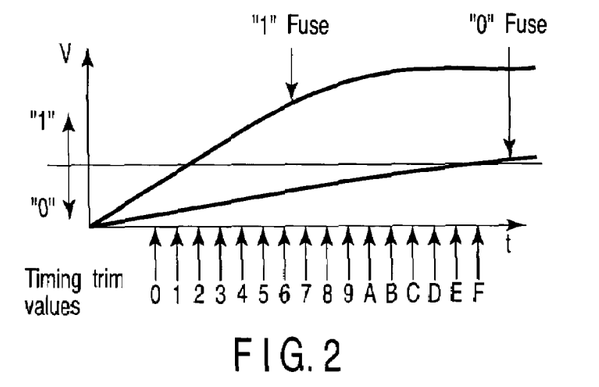
FIG. 2 shows the characteristics of electrically writable fuses.

There exists a difference in resistance between a "1" fuse into which data "1" has been written in advance (i.e., fuse storing "1") and a "0" fuse which has not been written with data "1" (i.e., a fuse storing "0"). FIG. 2 shows the rising characteristic of the voltage across a fuse when a constant voltage is applied across it. That is, after voltage application, the voltage across a "1" fuse rises faster and reaches a large value more early than the voltage across a "0" fuse. As a result, after the lapse of a fixed time, a large voltage difference is produced between the "1" and "0" fuses according to the difference in resistance between them.

In reading data from the data fuse 11, whether it is a "1" fuse or a "0" fuse can be decided by detecting the magnitude relationship between the voltage across the fuse and a certain decision reference voltage at a point in time after voltage application.

In this embodiment, the timing of reading of the voltage across the fuse after a constant voltage has been applied across it is optimized under the control of the read trim value automatic adjustment circuit 13. As a result, it becomes possible to accurately read data from the data fuse 11, which allows the design margin, process margin and reliability of circuits that use fuse data to be improved.

Figure 3A:
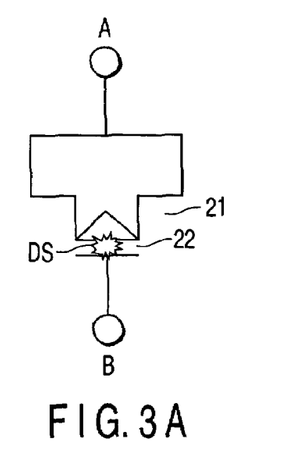
FIGS. 3A, 3B and 3C schematically show the configurations of fuses used in the semiconductor integrated circuit of FIG. 1.
Figure 3B:
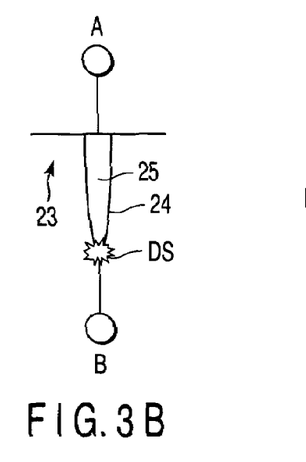
Figure 3C:
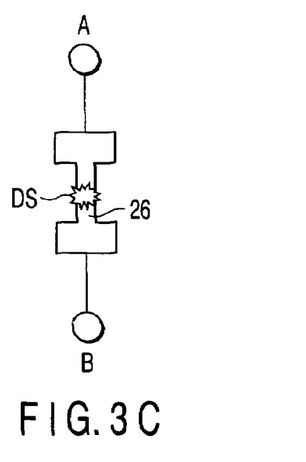

As the electrically writable data fuses are known various types, such as the gate oxide destruction type, the deep trench oxide destruction type, the polysilicon blow type, etc. FIGS. 3A to 3C schematically show various configurations of data fuses.

FIG. 3A shows a fuse of the gate oxide destruction type, which includes a MOS transistor 21 having source, drain and gate. When a high voltage is applied between the node A connected in common to the source and drain of MOS transistor 21 and the gate node B, the gate insulating film 22 is destroyed (the destroyed portion is indicated at DS), allowing data to be written into the fuse. After data has been written into the fuse, the nodes A and B short. That is, the fuse of FIG. 3A is anti-fuse.

FIG. 3B shows a fuse of the DT oxide destruction type, which has a structure such that a deep trench formed in a semiconductor substrate 23 is filled with a polysilicon electrode 25 with a gate insulating film 24 interposed therebetween. When a high voltage is applied between the node A connected to the polysilicon electrode 25 and the node B connected to the substrate, the gate insulating film 24 is destroyed (the destroyed portion is indicated at DS), allowing data to be written into the fuse. After data has been written into the fuse, the nodes A and B short. That is, the fuse of FIG. 3B is also anti-fuse.

FIG. 3C shows a fuse of the polysilicon blow type, which includes a polysilicon fuse 26 formed on a semiconductor substrate. When a high voltage is applied between the nodes A and B at both ends of the polysilicon fuse 26 and consequently a large current flows between the nodes, the polysilicon fuse 26 is blowed (the blowed portion is indicated at DS), allowing data to be written into the fuse. That is, in the case of the fuse of FIG. 3C, the nodes A and B are made open after data has been written.

Figure 4:
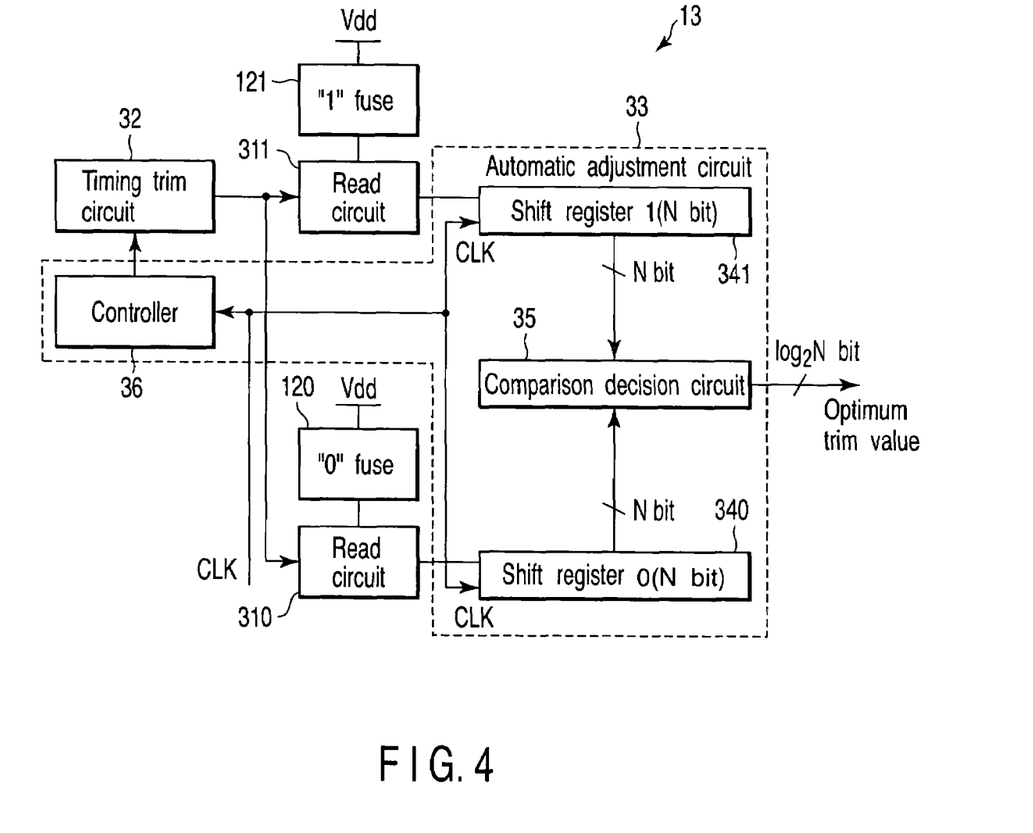
FIG. 4 is a block diagram of the read trim value automatic adjustment circuit shown in FIG. 1.
Figure 5A:
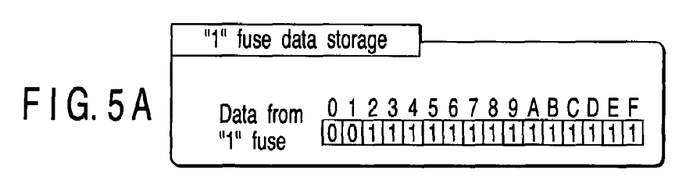
FIGS. 5A to 5D schematically show the trim value automatic adjustment operation of the read trim value automatic adjustment circuit shown in FIG. 4.
Figure 5B:
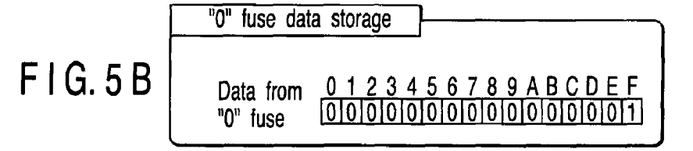
Figure 5C:
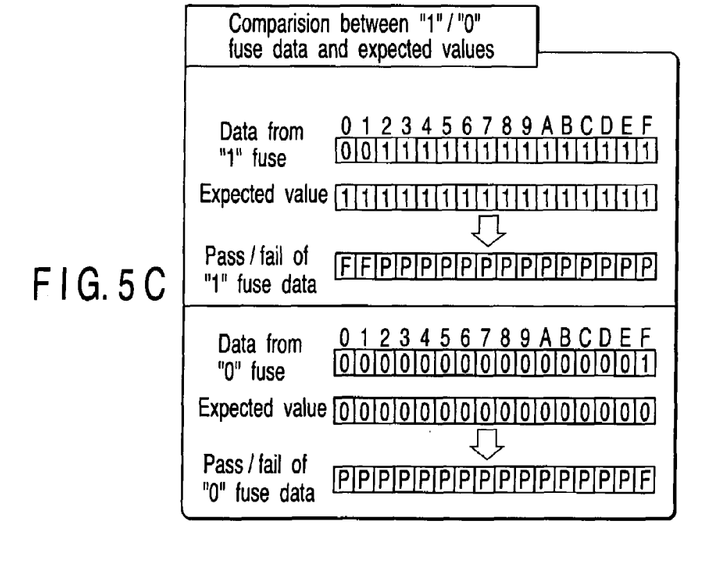
Figure 5D:
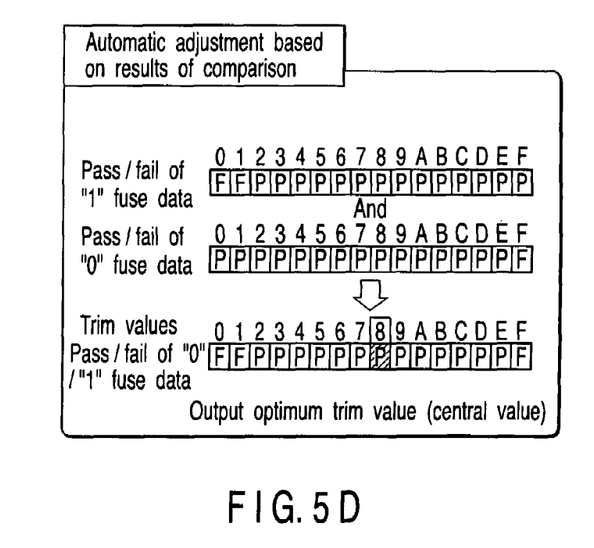

FIG. 4 shows specific circuit arrangements of the read trim value automatic adjustment circuit 13 and the adjustment fuse circuit 12 shown in FIG. 1. FIGS. 5A to 5D are schematic illustrations of a trim value automatic adjustment operation by the read trim value automatic adjustment circuit 13 shown in FIG. 4.

The adjustment fuse circuit 12 has a fuse 120 for "0" adjustment and a fuse 121 for "1" adjustment. The read trim value automatic adjustment circuit 13 has two adjustment fuse data read circuits 310 and 311, a timing trim circuit 32, and an automatic adjustment circuit 33.

The automatic adjustment circuit 33 includes two N-bit shift registers 340 and 341 which temporarily hold outputs of the fuse data read circuits 310 and 311 (i.e., read data from the adjustment fuses 120 and 121), respectively, a comparison decision circuit 35 which makes a comparison between the contents of the two shift registers, then decides and outputs the optimum trim value, and a controller 36 which controls the timing trim circuit 32.

The controller 36 is governed by a clock signal CLK to control the timing trim circuit 32 in reading data from the adjustment fuses 120 and 121. The timing trim circuit 32 sets the reading times at each of which the read circuits 310 and 311 read data from the adjustment fuses 120 and 121, respectively.

After application of a constant voltage across each of the adjustment fuses 120 and 121, the read circuits 310 and 311 read the fuse voltages at each of the read times set by the timing trim circuit 32 and then detects whether the read fuse voltages are larger or smaller than a reference voltage. The read fuse voltage is decided to be a "1" if it is larger than the reference voltage and a "0" otherwise.

Figure 6A:
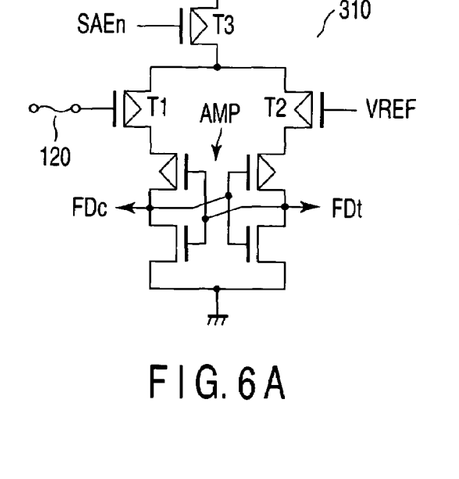
FIGS. 6A and 6B are circuit diagrams of the adjustment fuse data read circuit shown in FIG. 4.
Figure 6B:
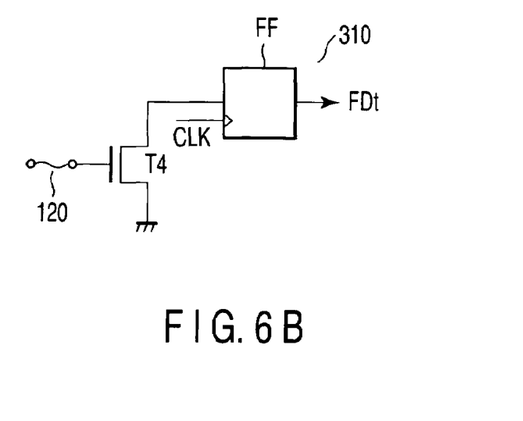

FIGS. 6A and 6B shows specific circuit arrangements of the read circuit 310 shown in FIG. 4. The read circuits 310 and 311 have the same circuit arrangement but differ from each other in the adjustment fuses connected thereto.

The read circuit 310 shown in FIG. 6A includes a pair of input PMOS transistors T1 and T2, a CMOS sense amplifier AMP connected to the PMOS transistors T1 and T2, and an activation control PMOS transistor T3. The transistors T1 and T2 are connected at their gates to receive a voltage at a node the potential on which is dependent upon the data storage condition of the fuse 120, for example, the voltage at one end of the fuse 120, and the reference voltage VREF, respectively. The transistor T3 is responsive to a timing signal SAEn to control the operation of the input PMOS transistors and the sense amplifier.

When the PMOS transistor T3 is turned on by the timing signal SAEn, a comparison is made between the input voltage from the fuse 120 and the reference voltage VREF. The sense amplifier AMP then detects the result of comparison to output complementary fuse data FDt and FDc.

The read circuit 310 shown in FIG. 6B includes an input NMOS transistor T4 and a flip-flop circuit FF. The transistor T4 is connected at its gate to receive a voltage at a node the potential on which is dependent upon the data storage condition of the fuse 120, for example, the voltage at one end of the fuse. The flip-flop circuit FF is connected to receive the voltage on the output node (drain) of that transistor T4 and is clocked by a clock signal CLK. With this read circuit, the reference voltage VREF is determined by the threshold voltage of the input NMOS transistor T4 and the threshold voltage of the flip-flop circuit FF. Therefore, the value of the reference voltage VREF becomes fixed.

With the read circuit shown in FIG. 6B, a comparison is made between the input voltage from the adjustment fuse 120 and the reference voltage VREF. The result of comparison is latched into the flip-flop circuit FF in synchronism with the clock signal CLK and then output as fuse data FDt.

The shift registers 340 and 341 shown in FIG. 4 sequentially latch decision data from the read circuits 310 and 311, respectively, in synchronism with the clock signal CLK.

The comparison decision circuit 35 compares N-bit data latched by each of the shift registers 340 and 341 (16-bit data in this example) with an expected value, determines the times when data of "1s" and "0s" are successfully read from the "1" and "0" adjustment fuses 120 and 121, respectively, and outputs one of these time values, for example, the central time value, as the optimum trim value of, say, $\log_2$ N bits (four bits in this example). Specifically, N bits of data read from the "0" adjustment shift register 340 are compared in sequence with "0" as the expected value, while N bits of data read from the "1" adjustment shift register 341 are compared in sequence with "1" as the expected value. The times when data that pass the comparison were read are determined and then the central time value is output as the optimum trim value.

In the read trim value automatic adjustment circuit 13 of FIG. 4, fuse data are read from each of the adjustment fuses 120 and 121 at different times and then stored into the corresponding shift register. Based on the stored contents of the shift registers, the comparison decision circuit 35 determines the optimum trim value to specify the time when data of "1" and "0" are successfully read from the adjustment fuses. The comparison decision circuit 35 which finds the optimum trim value can be implemented flexibly by using various gate circuits in combination.

Second Embodiment

Figure 7:
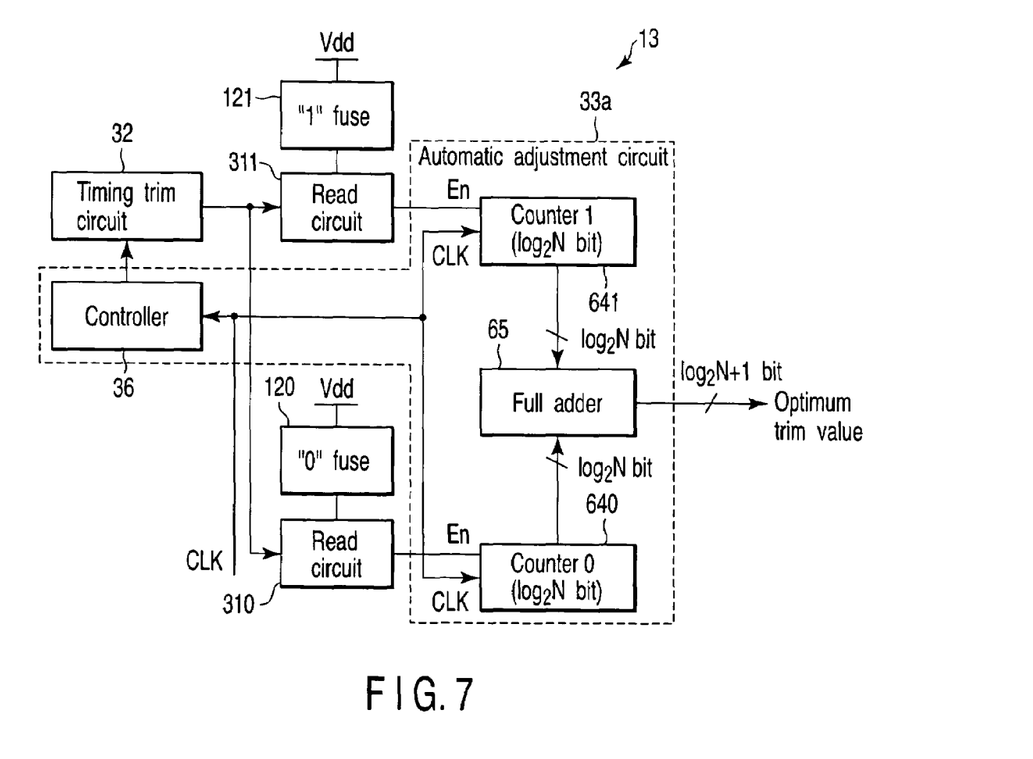
FIG. 7 is a block diagram of a semiconductor integrated circuit according to a second embodiment of the present invention.

FIG. 7 shows specific circuit arrangements of the read trim value automatic adjustment circuit 13 and the adjustment fuse circuit 12 in a data read circuit according to a second embodiment of the present invention.

The read trim value automatic adjustment circuit 13 of the second embodiment has two adjustment fuse data read circuits 310 and 311, a timing trim circuit 32, and an automatic adjustment circuit 33a. The automatic adjustment circuit 33a is different from the automatic adjustment circuit 33 shown in FIG. 4 in that the shift registers 340 and 341 are replaced by counter circuits (e.g., down counters) 640 and 641, respectively, and the comparison decision circuit 35 is replaced by an adder (e.g., a full adder) 65.

In this embodiment, as the down counters 640 and 641 use is made of counters of $\log_2$ N bits (four bits in this example and N is the set number of read times). The initial value in each counter is zero.

The fuse data En ("0" or "1") read through the read circuits 310 and 311 from the "0" and "1" adjustment fuses 120 and 121 at different times are input to the down counters 640 and 641, respectively. Each of the down counters 640 and 641 is decremented by one whenever a "1" is input (i.e., the count changes Thus 0, 15, 14, . . . ).

After data have been read a plurality of times, the count outputs of the down counters 640 and 641 are added together in the full adder 65. In this case, the least significant bit is ignored and the value midway between the count output values of the two counters is output as the optimum trim value. For example, when, after data have been read a plurality of times, the count content in the down counter 641 corresponding to the "1" adjustment fuse 121 is 2 and the count content in the down counter 640 corresponding to the "0" adjustment fuse 120 is 14, the optimum trim value output from the full adder 65 is 8, which is midway between 2 and 14. The initial value in each down counter may be set to a value other than 0, which allows fine adjustment of the optimum trim value.

Third Embodiment

Figure 8:
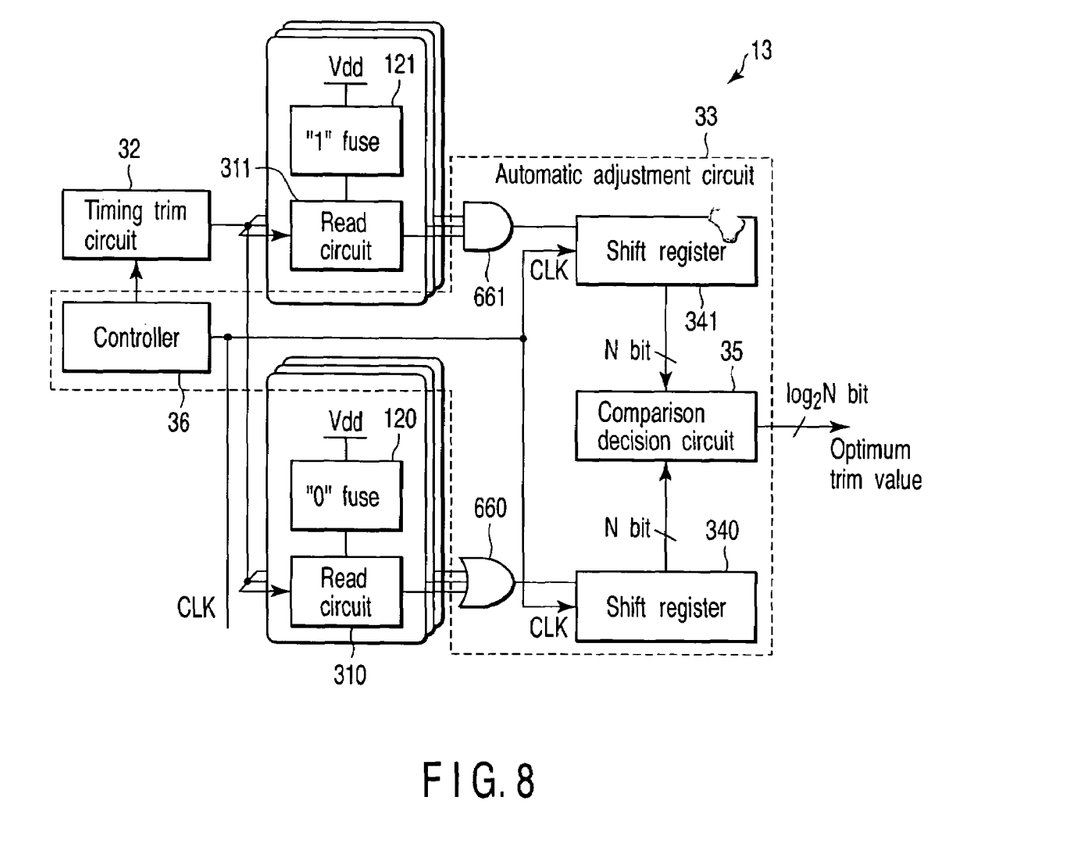
FIG. 8 is a block diagram of a semiconductor integrated circuit according to a third embodiment of the present invention.

FIG. 8 shows specific circuit arrangements of the read trim value automatic adjustment circuit 13 and the adjustment fuse circuit 12 in a data read circuit according to a third embodiment of the present invention.

In the third embodiment, the adjustment fuse circuit 12 has two or more "0" adjustment fuses 120 and two or more "1" adjustment fuses 121. Correspondingly, the read trim value automatic adjustment circuit 13 has two or more "0" adjustment fuse data read circuits 310 and two or more "1" adjustment fuse data read circuits 311. The automatic adjustment circuit 33 further includes an OR circuit 660 which ORs the outputs of the "0" adjustment fuse data read circuits 310 and an AND circuit 661 which ANDs the outputs of the "1" adjustment fuse data read circuits 311. The output of the OR circuit 660 is input to the "0" adjustment shift register 340. The output of the AND circuit 661 is input to the "1" adjustment shift register 341.

The third embodiment is provided with two or more fuses for each of the adjustment fuses 120 and 121 and thus allows for large variations in characteristics among the fuses.

Fourth Embodiment

Figure 9:
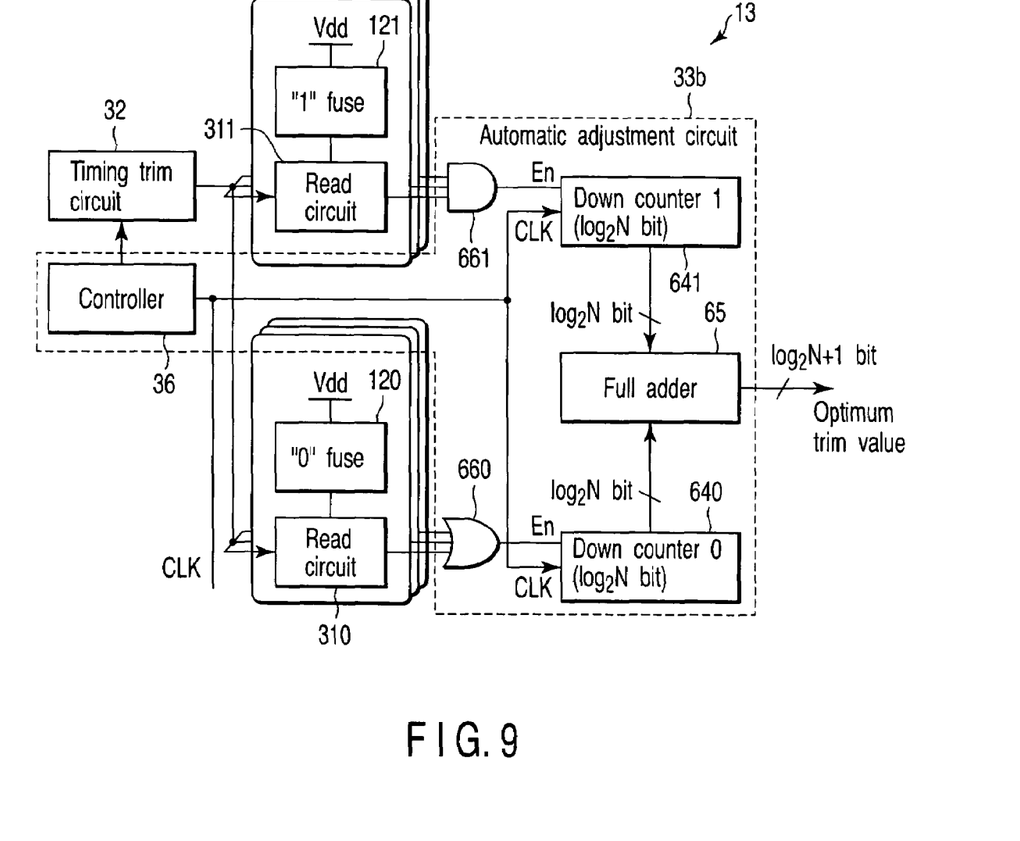
FIG. 9 is a block diagram of a semiconductor integrated circuit according to a fourth embodiment of the present invention.

FIG. 9 shows specific circuit arrangements of the read trim value automatic adjustment circuit 13 and the adjustment fuse circuit 12 in a data read circuit according to a fourth embodiment of the present invention.

The fourth embodiment differs from the third embodiment in that the shift registers 340 and 341 are replaced by down counters 640 and 641, respectively, and the comparison decision circuit 35 is replaced by a full adder 65 as in the read trim value automatic adjustment circuit described previously with reference to FIG. 7. As with the third embodiment, the fourth embodiment also allows for large variations in characteristics among the adjustment fuses.

Fifth Embodiment

Figure 10:
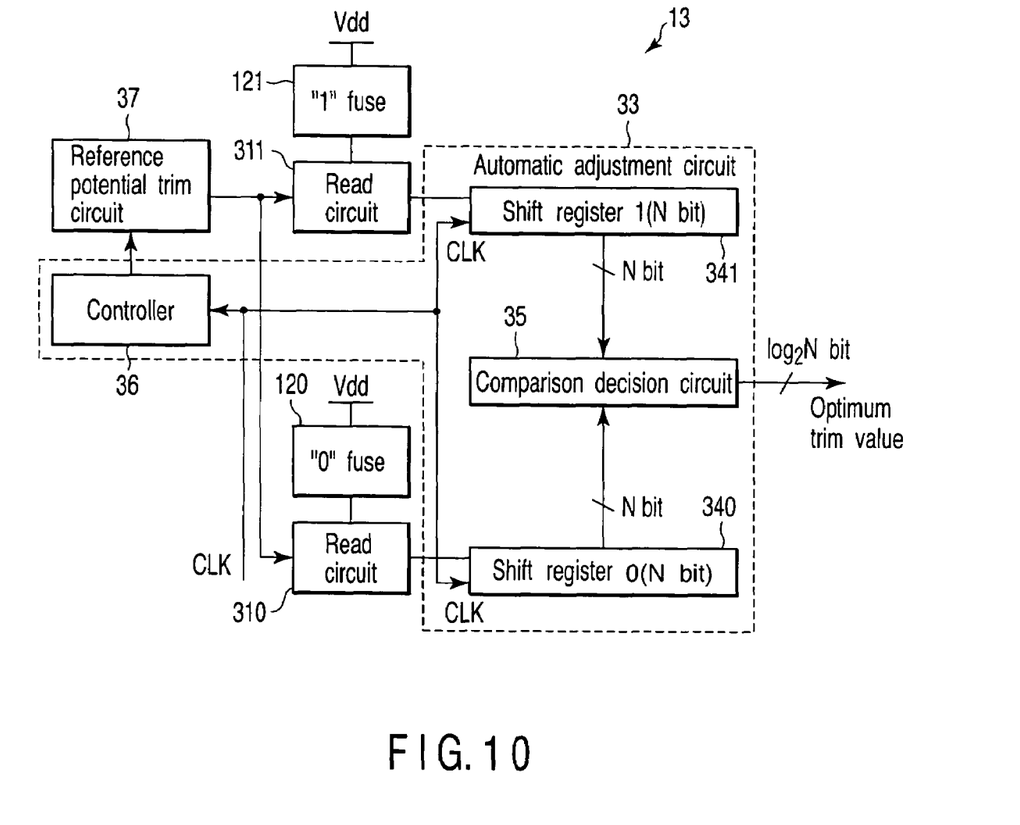
FIG. 10 is a block diagram of a semiconductor integrated circuit according to a fifth embodiment of the present invention.

FIG. 10 shows specific circuit arrangements of the read trim value automatic adjustment circuit 13 and the adjustment fuse circuit 12 in a data read circuit according to a fifth embodiment of the present invention.

In the first embodiment, the timing trim circuit 32 is provided in the read trim value automatic adjustment circuit 13 to set the timing by which the read circuits 310 and 311 read data from the adjustment fuses 120 and 121.

In contrast, in the fifth embodiment, a reference potential trim circuit 37 is provided in the read trim value automatic adjustment circuit 13 in place of the timing trim circuit 32. The reference potential trim circuit 37, which is controlled by the controller 36, sets reading reference potentials displaced in magnitude in the adjustment fuse data read circuits 310 and 311, allowing a predetermined number of fuse data read operations to be performed.

The automatic adjustment circuit 33 outputs the optimum trim value for the read reference potentials in place of the optimum trim value for the read timing and outputs it to the fuse data read circuit 14 shown in FIG. 1. In the fuse data read circuit 14, a read reference potential is set according to the trim value output from the automatic adjustment circuit 33. In reading data from the data fuse 11, the fuse data read circuit 14 applies a constant voltage across the data fuse 11, then makes a comparison between the voltage across the data fuse 11 and the read reference potential and decides whether data stored in the data fuse 11 is a "1" or "0".

In this embodiment, the read reference potential used for comparison with the voltage across the data fuse 11 after application of a constant voltage across it to decide stored fuse data is set to the optimum value by the read trim value automatic adjustment circuit. As a result, data can be accurately read from the data fuse 11, thus improving the design margin, process margin and reliability of circuits that use fuse data.

Sixth Embodiment

Figure 11:
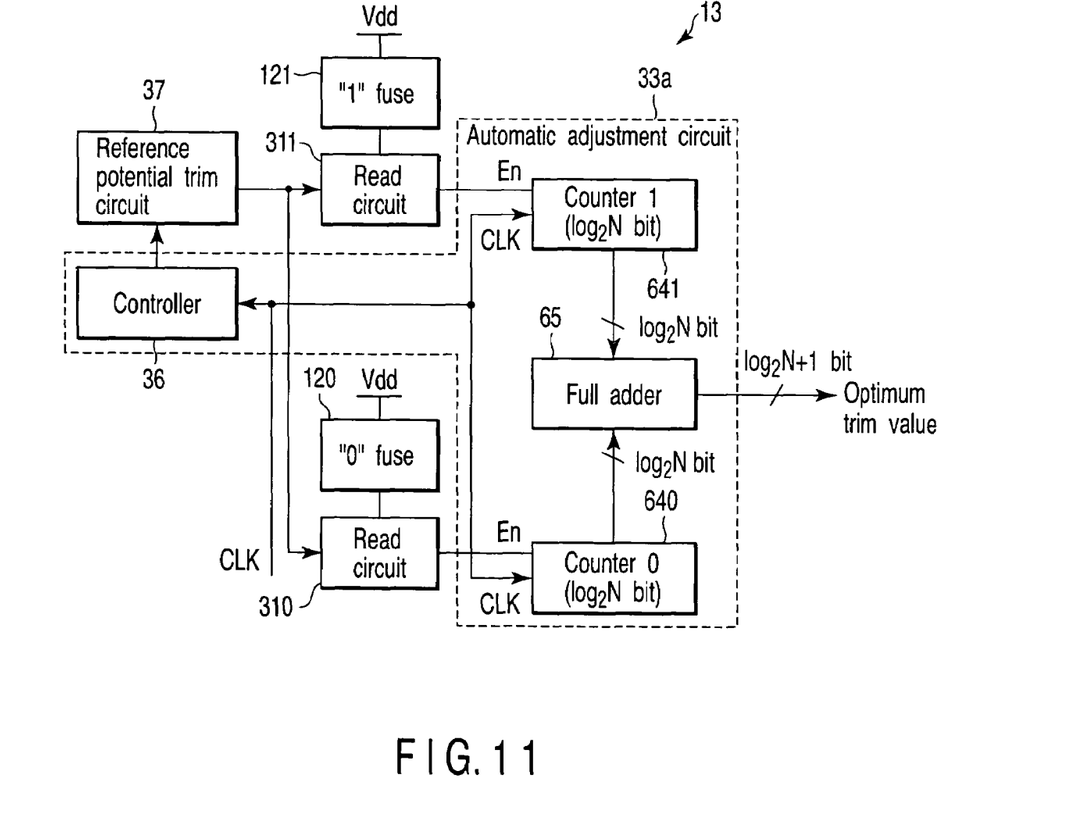
FIG. 11 is a block diagram of a semiconductor integrated circuit according to a sixth embodiment of the present invention.

FIG. 11 shows specific circuit arrangements of the read trim value automatic adjustment circuit 13 and the adjustment fuse circuit 12 in a data read circuit according to a sixth embodiment of the present invention.

In the sixth embodiment, as in the fifth embodiment, the timing trim circuit 32 in the second embodiment is replaced by the reference potential trim circuit 37.

Seventh Embodiment

Figure 12:
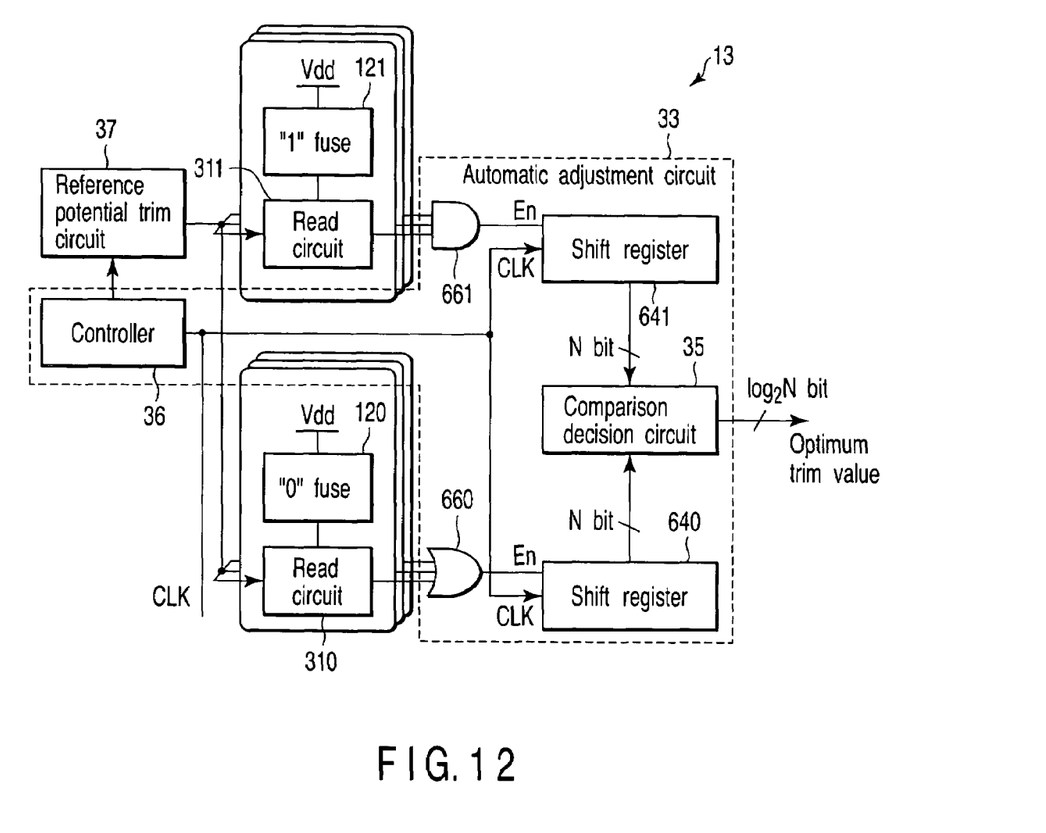
FIG. 12 is a block diagram of a semiconductor integrated circuit according to a seventh embodiment of the present invention.

FIG. 12 shows specific circuit arrangements of the read trim value automatic adjustment circuit 13 and the adjustment fuse circuit 12 in a data read circuit according to a seventh embodiment of the present invention.

In the seventh embodiment, as in the fifth embodiment, the timing trim circuit 32 in the third embodiment is replaced by the reference potential trim circuit 37.

Eighth Embodiment

Figure 13:
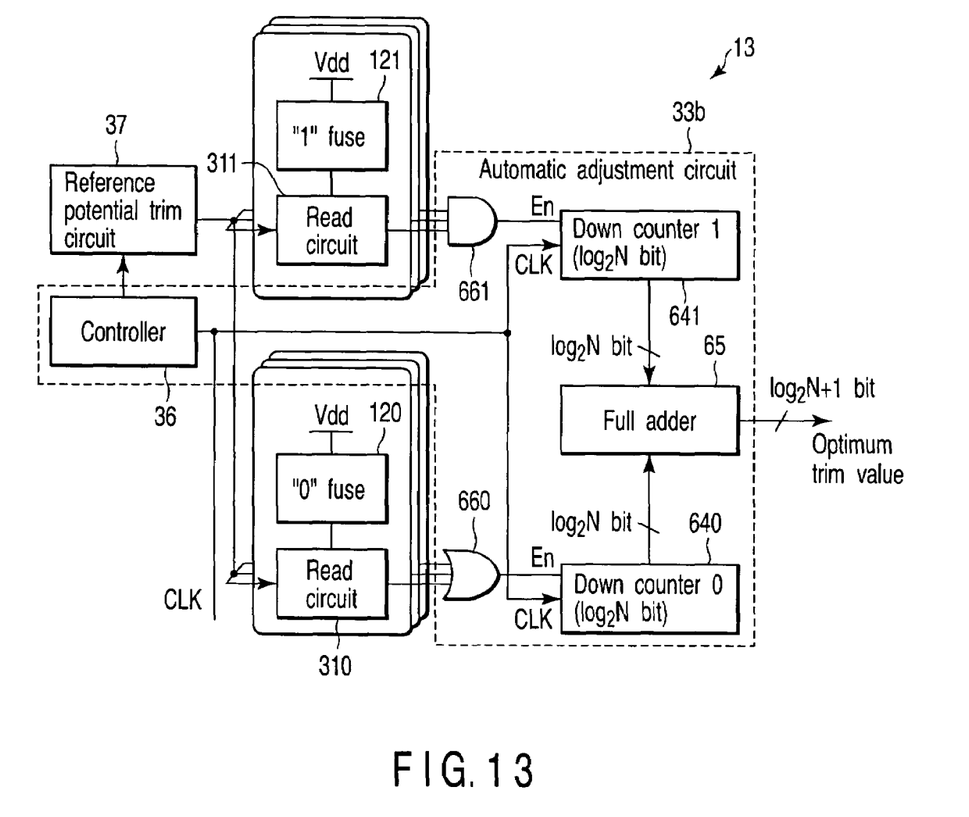
FIG. 13 is a block diagram of a semiconductor integrated circuit according to an eighth embodiment of the present invention.

FIG. 13 shows specific circuit arrangements of the read trim value automatic adjustment circuit 13 and the adjustment fuse circuit 12 in a data read circuit according to an eighth embodiment of the present invention.

In the eighth embodiment, as in the fifth embodiment, the timing trim circuit 32 in the fourth embodiment is replaced by the reference potential trim circuit 37.

Ninth Embodiment

Figure 14:
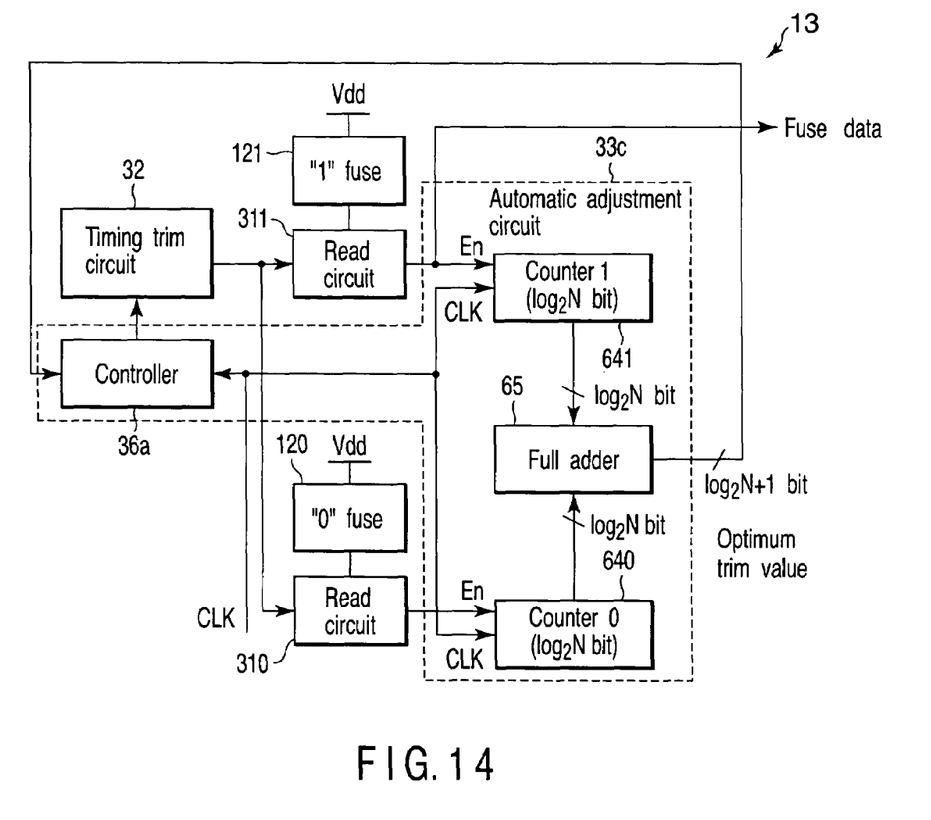
FIG. 14 is a block diagram of a semiconductor integrated circuit according to a ninth embodiment of the present invention.

FIG. 14 shows specific circuit arrangements of the read trim value automatic adjustment circuit 13 and the adjustment fuse circuit 12 in a data read circuit according to a ninth embodiment of the present invention. In the fuse data read circuit of the ninth embodiment, a "1" adjustment fuse 121 is used as a data fuse as well.

In the ninth embodiment, the automatic adjustment circuit 33a shown in FIG. 7 is replaced by an automatic adjustment circuit 33c which includes the down counters 640 and 641, the full adder 65, and the controller 36a.

The controller 36a controls the timing trim circuit 32 to set trim values at the time of adjustment described above. After the determination of the optimum trim value, the controller 36a is responsive to the optimum trim value from the full adder 65 to control the timing trim circuit 32 to set the trim value.

According to such a configuration, after the determination of the optimum trim value, data is read from the "1" adjustment fuse 121 using the optimum trim value, allowing data of a "1" to be read accurately and the design margin, process margin and reliability of circuits that use fuse data to be improved.

The determined optimum trim value can also be used with other fuses. Therefore, if it is known in advance that fixed values are present in fuse data, the provision of adjustment fuses is not required.

In the ninth embodiment, the down counters 640 and 641 and the full adder 65 may be replaced by the shift registers 340 and 341 and the comparison decision circuit 35, respectively, as shown in FIG. 4.

Tenth Embodiment

Figure 15:
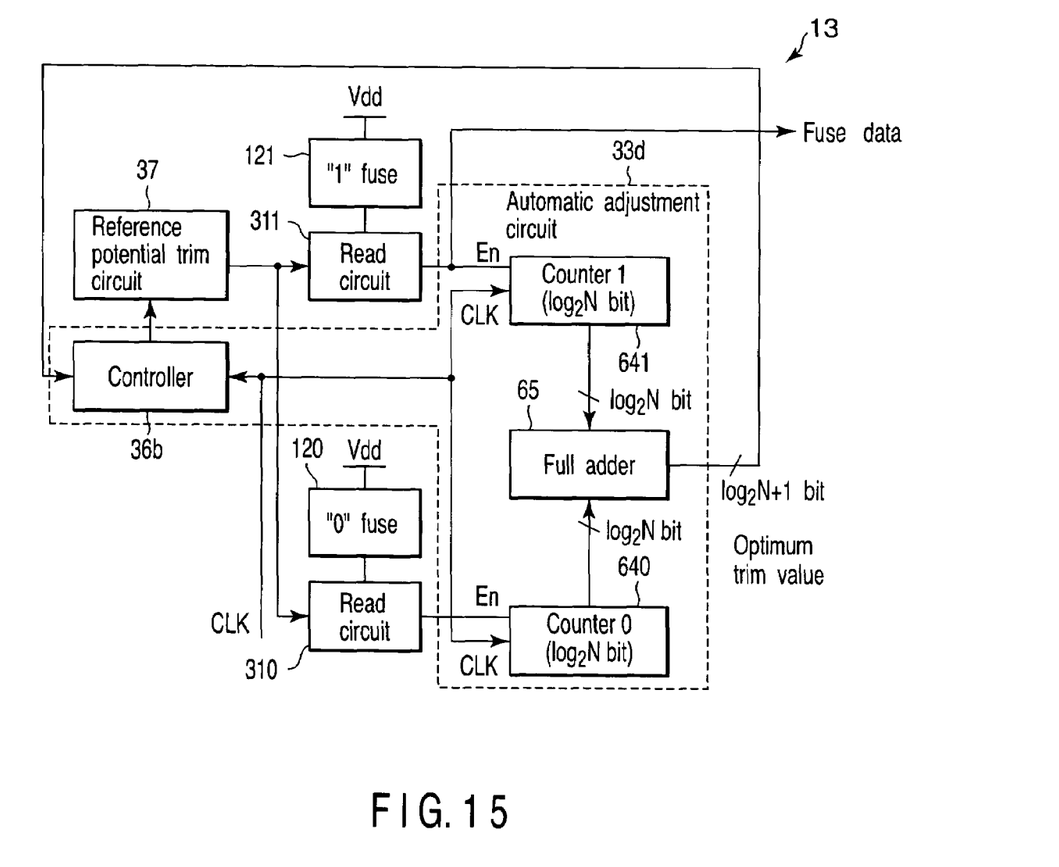
FIG. 15 is a block diagram of a semiconductor integrated circuit according to a tenth embodiment of the present invention.

FIG. 15 shows specific circuit arrangements of the read trim value automatic adjustment circuit 13 and the adjustment fuse circuit 12 in a data read circuit according to a tenth embodiment of the present invention. In the fuse data read circuit of the tenth embodiment, a "1" adjustment fuse 121 is used as a data fuse as well.

In the tenth embodiment, the automatic adjustment circuit 33a is replaced by an automatic adjustment circuit 33d. The automatic adjustment circuit 33d has two down counters 640 and 641, the full adder 65, and the controller 36b.

The controller 36b controls the reference potential trim circuit 37 to set trim value. After the determination of the optimum trim value, the controller 36b is responsive to the optimum trim value from the full adder 65 to control the reference potential trim circuit 37 to set the trim value.

According to such a configuration, after the determination of the optimum trim value, data is read from the "1" adjustment fuse 121 using the optimum trim value, allowing data of a "1" to be read accurately and the design margin, process margin and reliability of circuits that use fuse data to be improved.

The use of the "0" adjustment fuse 120 as a "0" data fuse allows data of a "0" to be read accurately using the determined optimum trim value.

The determined optimum trim value can also be used with other fuses. Therefore, if it is known in advance that fixed values are present in fuse data, the provision of adjustment fuses is not required.

In the tenth embodiment, the down counters 640 and 641 and the full adder 65 may be replaced by the shift registers 340 and 341 and the comparison decision circuit 35, respectively, as shown in FIG. 10.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

For example, although the embodiments have been described as the read trim value automatic adjustment circuit 13 being equipped with either of the timing trim circuit 32 and the reference potential trim circuit 37, both of them may be provided. In this case, it is possible to use the timing trim circuit 32 for reading data from the "0" adjustment fuse 120 and the reference potential trim circuit 37 for reading data from the "1" adjustment fuse 121. Such a configuration would allow the design margin, process margin and reliability to be further improved.

What is claimed is:

1. A semiconductor integrated circuit comprising:
   a data fuse element which stores data in the form of a variation in its resistance according to whether it has been subjected to an electrical write operation or not, the data being read upon application of a voltage across it;
   at least one adjustment fuse element which has substantially the same electrical characteristics as the data fuse element and determines a data read condition for the data fuse element;
   a trim value adjustment circuit which is connected to the adjustment fuse element and which applies a constant voltage across the adjustment fuse element prior to reading data from the data fuse element, then reads data from the adjustment fuse element and, on the basis of the results of the read, outputs a trim value to specify the read conditions for the data fuse element; and
   a fuse data read circuit which is connected to the trim value adjustment circuit and the data fuse element and which applies a constant voltage across the data fuse element and then reads data from the data fuse element according to the trim value output from the trim value adjustment circuit.

2. The semiconductor integrated circuit according to claim 1, wherein the trim value adjustment circuit after the start of application of the constant voltage across the adjustment fuse element to read data from it, reads the voltage across the adjustment fuse element at different read times, then compares the read voltage values with a decision reference voltage and, on the basis of the results of the comparison, outputs the trim value that specifies the timing of read data from the data fuse element.

3. The semiconductor integrated circuit according to claim 1, wherein the trim value adjustment circuit reads a voltage across the adjustment fuse element at a time after the start of application of the constant voltage across the adjustment fuse element to read data from it, then compares the read voltage value with different decision reference voltages and, on the basis of the results of the comparison, outputs the trim value that specifies a decision reference voltage used in reading data from the data fuse element.

4. The semiconductor integrated circuit according to claim 1, wherein the at least one adjustment fuse element includes a first adjustment fuse element which is written with first data and a second adjustment fuse element which is not written with the first data.

5. The semiconductor integrated circuit according to claim 4, wherein the trim value adjustment circuit includes a first read circuit connected to the first adjustment fuse element to read data from the first adjustment fuse element at different read times, a second read circuit connected to the second adjustment fuse element to read data from the second adjustment fuse element at different read times, a timing trim circuit connected to the first and second read circuits to set the read times in each of the first and second read circuits, and an adjustment circuit connected to the first and second read circuits to output the trim value which specifies the timing of reading data from the data fuse element on the basis of data read in sequence from each of the first and second adjustment fuse elements.

6. The semiconductor integrated circuit according to claim 5, wherein the adjustment circuit includes a first shift register connected to the first read circuit to hold data read in sequence from the first adjustment fuse element, a second shift register connected to the second read circuit to hold data read in sequence from the second adjustment fuse element, and a comparison decision circuit connected to the first and second shift registers to compare the contents of the first and second shift registers and output the trim value on the basis of the results of the comparison.

7. The semiconductor integrated circuit according to claim 5, wherein the read times set by the timing trim circuit in each of the first and second read circuits are displaced from one another.

8. The semiconductor integrated circuit according to claim 6, wherein the comparison decision circuit compares the contents of the first and second shift registers, then detects read time when data are successfully read from both the first and second adjustment fuse elements and outputs the trim value on the basis of the detected read time.

9. The semiconductor integrated circuit according to claim 5, wherein the adjustment circuit includes a first down counter connected to the first read circuit to count data read in sequence from the first adjustment fuse element, a second down counter connected to the second read circuit to count data read in sequence from the second adjustment fuse element, and a full adder connected to the first and second down counters to add the counts in the first and second down counters and output the trim value on the basis of the result of the addition.

10. The semiconductor integrated circuit according to claim 1, wherein the at least one adjustment fuse element includes a plurality of first adjustment fuse elements each of which is written with first data and a plurality of second adjustment fuse elements each of which is not written with the first data.

11. The semiconductor integrated circuit according to claim 10, wherein the trim value adjustment circuit includes a plurality of first read circuit each of which is connected to a corresponding one of the first adjustment fuse elements to read data from the corresponding first adjustment fuse element at different read times, a plurality of second read circuit each of which is connected to a corresponding one of the second adjustment fuse elements to read data from the corresponding second adjustment fuse element at different read times, a timing trim circuit connected to the first and second read circuits to set the different read times in each of the first and second read circuits, and an adjustment circuit connected to the first and second read circuits to output the trim value which specifies the desired timing of read data from the data fuse element on the basis of data read in sequence from each of the first and second adjustment fuse elements.

12. The semiconductor integrated circuit according to claim 11, wherein the adjustment circuit includes an OR circuit which is connected to the first read circuits to OR data read therefrom, a first shift register connected to the OR circuit to hold its outputs, an AND circuit which is connected to the second read circuits to AND data read therefrom, a second shift register connected to the AND circuit to hold its outputs, and a comparison decision circuit connected to the first and second shift registers to compare the contents of the first and second shift registers and output the trim value on the basis of the results of the comparison.

13. The semiconductor integrated circuit according to claim 11, wherein the read times set by the timing trim circuit in each of the first and second read circuits are displaced from one another.

14. The semiconductor integrated circuit according to claim 12, wherein the comparison decision circuit compares the contents of the first and second shift registers to detect read times when data are successfully read from both the first and second adjustment fuse elements and outputs the trim value on the basis of the detected read times.

15. The semiconductor integrated circuit according to claim 11, wherein the adjustment circuit includes an OR circuits which is connected to the first read circuits to OR data read therefrom, a first down counter connected to the OR circuit to hold its outputs, an AND circuit which is connected to the second read circuits to AND data read therefrom, a second down counter connected to the AND circuit to hold its outputs, and an adder connected to the first and second down counters to add the counts in the first and second down counters and output the trim value on the basis of the result of the addition.

16. The semiconductor integrated circuit according to claim 15, wherein the adder adds the counts in the first and second down counters to detect read time when data are successfully read from both the first and second adjustment fuse elements and outputs the trim value on the basis of the detected read time.

17. The semiconductor integrated circuit according to claim 16, wherein the adder is a full adder.

18. A semiconductor integrated circuit having first and second modes comprising:

a first fuse element which stores data in the form of a variation in its resistance according to whether it has been subjected to an electrical write operation or not, the data being read upon application of a voltage across it;

a second fuse element which has substantially the same electrical characteristics as the first fuse element and determines data read conditions for the first fuse element;

a first fuse data read circuit which is connected to the second fuse element and reads data from the second fuse element at read times in the first mode;

a second fuse data read circuit which is connected to the first fuse element to read data from the first fuse element at different times in the first mode and read data from the first fuse element at a time specified by an externally applied trim value in the second mode; and a trim value adjustment circuit which is connected to the first and second fuse data read circuits and which generates a trim value to specify a desired read condition for the first fuse element in the first mode on the basis of data read through the first and second fuse data read circuits from the first and second fuse elements and then sets the timing of reading data from the first fuse element in the second fuse data read circuit in the second mode on the basis of the trim value.

19. The semiconductor integrated circuit according to claim 18, wherein the trim value adjustment circuit, after the start of application of the constant voltage across each of the first and second fuse elements to read data from it, reads the voltage across each of the first and second fuse elements at different read times and then compares the read voltage values with a decision reference voltage in the first mode and, on the basis of the results of the comparison, outputs the trim value that specifies the timing of reading data from the first fuse element in the second mode.

20. The semiconductor integrated circuit according to claim 18, wherein the trim value adjustment circuit reads a voltage across each of the first and second fuse element at a time after the start of application of the constant voltage across the it and then compares the read voltage value with different decision reference voltages in the first mode and, on the basis of the results of the comparison, outputs the trim value that specifies a decision reference voltage used in reading data from the first fuse element in the second mode.

* * * * *